United States Patent [19]

Faktor et al.

[11] 4,339,302

[45] Jul. 13, 1982

[54] SEMICONDUCTOR MATERIALS

[75] Inventors: Marc M. Faktor, Bushey Heath; John Haigh, Ipswich, both of England

[73] Assignee: The Post Office, London, England

[21] Appl. No.: 184,620

[22] Filed: Sep. 5, 1980

[30] Foreign Application Priority Data

Sep. 10, 1979 [GB] United Kingdom ............... 7931278
Dec. 28, 1979 [GB] United Kingdom ............... 7944418

[51] Int. Cl.³ .......................................... C30B 29/40
[52] U.S. Cl. ........................... 156/605; 156/DIG. 66; 156/DIG. 70; 75/62
[58] Field of Search ................. 156/605, 607, 616 R, 156/617 SP, 620, 624, DIG. 66, DIG. 70; 164/55–57; 23/300; 75/84, 134 T

[56] References Cited

U.S. PATENT DOCUMENTS 2,898,278  8/1959  Plust ........................................ 75/84
3,093,475  6/1963  Dryer, Jr. .............................. 75/84

OTHER PUBLICATIONS

"Pair Spectra", Dean et al., published in J. of Applied Physics., vol. 41, Jul. 1970, pp. 3475-3479.
Minden, "Intermetallic Semiconductors", published in Semiconductor Products, Feb. 1959, pp. 30–42.

*Primary Examiner*—Gregory N. Clements
*Attorney, Agent, or Firm*—Cushman, Darby & Cushman

[57] ABSTRACT

A Group III element Q selected from gallium, indium and thallium containing a Group VI element X selected from oxygen, sulphur, selenium and tellurium as an impurity can be purified by adding, to molten Q, an element M capable of forming with X a stable solid compound substantially insoluble in liquid Q. The stable solid compound can be separated and the purified Q used in the epitaxial growth of a semiconductor material such as indium phosphide. Alternatively, in a process for the epitaxial growth of a semiconductor compound of Q in molten Q, X can be removed in situ by the addition of a suitable element of the M-type.

19 Claims, No Drawings

SEMICONDUCTOR MATERIALS

This invention relates to a process for purifying Group III elements, i.e. gallium, indium or thallium, and to the use of the purified elements in semiconductor materials, e.g. indium phosphide, which are prepared by liquid phase epitaxy.

Elemental indium and, to a lesser extent, elemental gallium, are widely used as solvent for the epitaxial growth of certain semiconductor compounds of gallium and/or indium with a Group V element, e.g. phosphorus, arsenic or antimony. For example, liquid indium is used as a solvent for the epitaxial growth of indium-containing semiconductor compounds, notably indium phosphide and gallium indium arsenide. Indium phosphide is finding extensive application in the production of optoelectronic devices such as lasers and detectors, having a wavelength range of from 1.0 to 1.6 $\mu$m, for use in optical communication systems; it is also being used to an increasing extent in microwave devices. However, the use of epitaxial indium phosphide layers in optoelectronic devices is hampered by the difficulty of preparing it by liquid phase epitaxy with a sufficiently low background doping level.

Indium phosphide is usually grown epitaxially from solution in liquid indium at a temperature of 600° to 700° C. Elemental indium normally contains trace amounts (about 1 ppm) of the Group VI elements oxygen, sulphur, selenium and/or tellurium (sometimes known as chalcogens) and these are preferentially incorporated in the growing indium phosphide crystal where they act as n-type dopants, making it very difficult to achieve a lower carrier concentration; the concentration is normally at least $10^{16}$ cm$^{-3}$ and is often much higher. It has been shown by secondary-ion mass spectrometry that silicon, often thought to be the dominant impurity, is present in insignificant levels by comparison with sulphur.

It has hitherto been prohibitively difficult to obtain indium having a total content of the given Group VI elements, below 1 ppm and, having once achieved such low levels of these elements, it is difficult to avoid increasing them during handling.

Chem. Abs. 90 (1979) 9731e discloses refining indium by the addition of a Zn-Al-Mg master alloy to the indium melt under a glycerol layer, followed by treatment with NH$_4$Cl.

U.S. Pat. No. 2,901,342 discloses the purification of indium, containing zinc as an impurity, by exposing molten indium to an oxygen-containing atmosphere.

U.S. Pat. No. 3,093,475 describes the refining of indium, containing impurities such as Cu, Fe, Ni and Cd, by mixing the molten indium with a solution of an alkali metal cyanide.

U.S. Pat. No. 2,477,799 relates to the purification of an indium-bearing acid solution, with respect to contaminants such as Se, Te and As, by reaction with sodium hydrosulphite (Na$_2$S$_2$O$_4$). The product of the multi-stage specific reaction detailed in this specification contains "traces" of Se and Te.

The article by Astles et al, "Indium phosphide II. Liquid Epitaxial Growth", J. Electrochem. Soc. 120, December 1973, pages 1750–1757, discusses the liquid epitaxial growth of InP.

It would be desirable to be able to provide indium, gallium or thallium with a high degree of purity, i.e. in which chalcogens have been removed substantially completely, in a simple, one-stage reaction, so that the purified metal would be suitable for use in the epitaxial growth of semiconductor compounds. It would be particularly desirable to provide a process in which the chalcogens were removed efficiently in the epitaxial growth process itself.

According to a first aspect of the present invention, a process for purifying a Group III element Q selected from gallium, indium and thallium in admixture with a Group VI element X selected from oxygen, sulphur, selenium and tellurium, comprises adding to the element Q, when molten, an element M capable of forming with the element X a stable solid compound substantially insoluble in the liquid element Q.

The reaction which takes place when the element M is added to the melt is shown in equilibrium reaction (1)

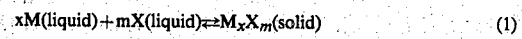

$$xM(\text{liquid}) + mX(\text{liquid}) \rightleftharpoons M_xX_m(\text{solid}) \qquad (1)$$

wherein m and x are determined by the respective valencies of the elements M and X.

The choice of the element M is governed by two conditions relating to the compound $M_xX_m$. The compound must be substantially insoluble in liquid Q, and it must be stable, i.e. the equilibrium in the reaction (1) must be substantially to the right.

A first group of suitable elements that satisfy the two conditions given above for the "scavenger" element M comprises the alkaline earth metals, especially barium and calcium. Each of these two elements forms compounds MX highly insoluble in, for example, liquid indium; these insoluble compounds rise to the top of the melt and may be removed by filtration. If desired, excess barium or calcium remaining in the melt may be removed by zone-refining, but this is not essential when the purified melt is to be used for a subsequent epitaxial growth stage; calcium and barium atoms are too large to enter into a indium phosphide crystal lattice and thus do not interfere with the epitaxial growth process.

A second group of suitable scavenging elements comprises the Group III elements scandium, yttrium and the lanthanides. Lanthanide elements and, especially, lanthanum, are preferred. If a lanthanide element is added to the melt in a stoichiometric excess so that all the chalcogens present will be converted to highly insoluble compounds, e.g. lanthanum sulphide (La$_2$S$_3$), these will rise to the top of the melt and, as described above, may be removed by filtration. Once again, it will usually be unnecessary to remove excess elements if they are too large to enter into an epitaxially grown semiconductor crystal lattice; lanthanide atoms are too large to enter the lattice of indium phosphide or gallium indium arsenide.

The conditions governing the selection of the element M for use as a scavenger in the process of the invention may be quantified as follows: If a residual chalcogen concentration [X] less than or equal to $10^{-7}$ mole/mole is required, and if the element M is to be used in a concentration [M] less than or equal to $10^{-3}$ mole/mole, the free energy change $\Delta G_1$ for the reaction (1) must conform to the inequality (2)

$$\exp(\Delta G_1/RT) = [M]^x[X]^m \leq 10^{-(3x+7m)} \qquad (2)$$

Calculations indicate that the lanthanides, as well as the alkaline earth metals magnesium, calcium, strontium and barium, satisfy this inequality.

By the purification process of the invention, the concentration of the element X with respect to the element Q can be reduced to less than 1 ppm. Such a purified product can be used in a process for the epitaxial growth of a crystalline semiconductor compound.

According to a second aspect of the present invention, a process for the epitaxial growth of a crystalline semiconductor compound of the formula QZ in molten Q, wherein Q is as defined above and Z is a Group V element selected from phosphorus, arsenic and antimony, comprises using, as the element Q, the product of a purification process according to the invention.

As already indicated, the insoluble compound $M_xX_m$ may simply be separated from the melt, for example by filtration, and the indium thus purified transferred to a liquid phase epitaxy apparatus where the growth process is carried out in an otherwise conventional manner. As also mentioned previously, the excess elemental M may optionally also be removed, for example by zone-refining, before the indium is transferred to the growth apparatus.

In an alternative, preferred method of working, however, the element M is added to the melt with the solute (the crystalline compound QZ) in the liquid phase epitaxy apparatus, so that the scavenging action of suitable elements of the M type can take place in situ, and the epitaxial growth process takes place in the presence of both the element M and the compound $M_xX_m$.

According to a third aspect of the present invention, therefore, a process for the epitaxial growth of a crystalline semiconductor material of the formula QZ in molten Q in admixture with an element X, wherein Q, Z and X are as defined above, comprises adding to the melt an element M' capable of reacting with X to form a stable solid compound substantially insoluble in liquid Q and substantially more stable under the conditions of the process than any compound formed by reaction between M' and Z.

It will be appreciated that there is an additional constraint, in this aspect of the invention, on the scavenging element with respect to the simple purification process in which no Z element is present. Accordingly, if the melt contains phosphorus or arsenic, the compound $M'_xX_m$ must be substantially more stable than any compound $M'_zP_m$ or $M'_zAs_m$ which can be formed. Accordingly, the equilibrium in the following reaction (3) should lie well over to the left (as an example when z=3):

$$3M'_xX_m(\text{solid}) + mxZ(\text{solution}) \rightleftharpoons xM'_3Z_m(\text{solid}) + 3mX(\text{solution}) \qquad (3)$$

Thus, in a typical case, for the concentration [X] to remain below $10^{-7}$ mole/mole when the concentration [Z] is approximately $10^{-2}$ mole/mole (a typical value in liquid phase epitaxy), the free energy change $\Delta G_2$ for the reaction (3) must conform to the following inequality (4)

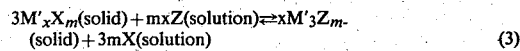
$$\exp(-\Delta G_2/RT) = [X]^{3m}[Z]^{-mx} \leq 10^{2mx-21m} \qquad (4)$$

An element which fulfils this condition as well as the one given previously is barium. Another such element is lanthanum, especially when X is sulphur and Z is phosphorus and/or arsenic.

In the invention, the element Q is preferably gallium or indium, or it may comprise a mixture thereof, e.g. when gallium indium phosphide is prepared. Most preferably, Q is indium.

Using barium as M in the invention, it has been possible to prepare epitaxial indium phosphide having a residual level of n-type dopants below $10^{16}$ cm$^{-3}$. Using lanthanum as the element M, epitaxial indium phosphide having residual n-type dopant levels ranging from $1 \times 10^{16}$ cm$^{-3}$ to $4 \times 10^{16}$ cm$^{-3}$, and epitaxial gallium indium arsenide having a level as low as $1 \times 10^{15}$ cm$^{-3}$, have been prepared.

The following Examples 1 to 3 are comparative, while Examples 4 to 8 illustrate the invention.

EXAMPLES 1 to 8

Indium phosphide and gallium indium arsenide layers were grown on (100) tin-doped indium phosphide substrates in a conventional sliding-boat liquid phase epitaxy apparatus. Melts were made up from 99.9999% indium and gallium and polycrystalline InP and GaAs with a net carrier concentration $N_o - N_A$ of less than $10^{16}$ cm$^{-3}$ (all from MCP Ltd). Approximately 1 mg of either barium (Anglian Chemicals Ltd) or Lanthanum (Cerac Ltd., 99.9% pure) was added to each melt, either as a pellet or as an approximately 1% solution or dispersion in indium. Before the growth of each layer or layer stack the substrate was allowed to dissolve back by about 5 μm in a pure indium melt; this leads to more uniform nucleation and growth. Net carrier concentrations in the layers were measured by electrochemical Schottky barrier profiling using a Post Office Plotter. The results are shown in the following Table:

| Example | QZ | Scavenger (M) | $N_o$-$N_A$ ($10^{16}$cm$^{-3}$) |
|---|---|---|---|
| 1 | InP | none | 50 |
| 2 | InP | none | 20 |
| 3 | GaInAs | none | 2 |
| 4 | InP | Ba | 2.2 |
| 5 | InP | Ba | 0.8 |
| 6 | InP | La | 2-4 |
| 7 | InP | La | 1 |
| 8 | GaInAs | La | 0.1 |

It may be seen that the use of a scavenger element can reduce the carrier level in InP layers by a factor of 10–100, and by a similar factor in GaInAs.

We have conducted experiments to ascertain whether the reduction in net carrier concentration associated with the use of barium and lanthanum in the melts might be due to the introduction of compensating acceptor levels. Such levels might be due to the dissolution of barium or lanthanum in the indium phosphide (unlikely in view of the known chemistry) or the dissolution of impurities, e.g. Ca, Mg or Zn, present in the barium or lanthanum. If this had been the case, the material would have only low mobility and its usefulness would be much less.

In addition, the experiments showed whether there were deep levels introduced by the scavenging agent or its impurities. These would also degrade the usefulness of the material.

Cathodoluminescence spectroscopy (CLS) reveals all these levels since transition of the type
(valence band)$\rightleftharpoons$(donor level)
(conduction band)$\rightleftharpoons$(acceptor level)
(level)$\rightleftharpoons$(level)
show up.

A layer of GaInAs grown from a lanthanum-scavenged melt with $N_D - N_A \simeq 1 - 5 \times 10^{15}$ was examined out to 2 μm wavelength. A very weak peak attributable to a (CB)⇌(acceptor) transition was observed, indicating, probably, a very low level of compensating acceptors.

Two layers of InP were examined. The first was grown from a melt scavenged with barium, and had $N_D - N_A = 4 \times 10^{16}$ cm$^{-3}$. The second was grown from a melt to which, in an attempt to produce scavenging, lanthanum arsenide had been added, but the carrier level $N_D - N_A$ was $8.5 \times 10^{16}$ cm$^{-3}$. Since the usual level without scavenging is $1 - 4 \times 10^{17}$ cm$^{-3}$, there was apparently only limited or no scavenging action in the second layer. Both samples gave almost the same CL spectrum consisting of a group of weak peaks. Since it is most unlikely that both scavenging agents, i.e. barium and lanthanum arsenide, introduce the same pattern of impurities and levels, it may be concluded that these levels are due to impurities or effects not associated with the scavenging agent. As before, the examination of levels went out to about 2 μm wavelength.

We claim:

1. A process for purifying a molten Group III element Q selected from the group consisting of gallium, indium, thallium and mixtures thereof in admixture with a Group VI element X selected from the group consisting of oxygen, sulfur, selenium and tellurium, the purification being sufficient to allow the epitaxial growth of a substantially dopant-free crystal Q from molten QX, said process comprising adding an element M, which is an alkaline earth metal excluding magnesium and which is capable of forming with the element X a stable solid compound substantially insoluble in liquid Q, to the melt provided that, if the M atoms are not too large to enter the lattice of the crystal, the stable solid compound MX and any excess M are separated from the melt.

2. A process according to claim 1 in which the residual concentration of the element X with respect to the element Q is less than 1 ppm.

3. A process according to claim 1 in which Q is selected from the group consisting of gallium and indium.

4. A process according to claim 3 in which Q is indium.

5. A process according to claim 1 in which M is barium.

6. A process according to claim 1 in which the stable solid compound is separated from the melt.

7. A process for the epitaxial growth of a crystalline semiconductor compound of the formula QZ in molten Q, wherein Q is as defined in claim 1 and Z is a Group V element selected from the group consisting of phosphorus, arsenic and antimony, in which Q has been purified by a process according to claim 1.

8. A process for the epitaxial growth of a crystalline semiconductor compound of the formula QZ from molten QZ in admixture with an element X,
wherein Q is a Group III element selected from the group consisting of gallium, indium, thallium and mixtures thereof, X is a Group VI element selected from oxygen, sulfur, selenium and tellurium, and
Z is a Group V element selected from phosphorus, arsenic and antimony,
comprising adding to the melt an element M' which is an alkaline earth metal excluding magnesium and which is capable of reacting with X to form a stable solid compound substantially insoluble in liquid Q and substantially more stable under the conditions of the process than any compound formed by reaction between M' and Z and in which the M' atoms are tool large to enter the lattice of the crystal.

9. A process according to claim 8 in which Z is selected from the group consisting of phosphorus and arsenic.

10. A process according to claim 9 in which Z is phosphorus.

11. A process according to claim 8 in which Q is selected from the group consisting of indium and gallium.

12. A process according to claim 11 in which Q is indium.

13. A process according to claim 8 in which QZ is selected from the group of semiconductor compounds indium phosphide and gallium indium arsenide.

14. A process according to claim 8 in which M' is barium.

15. A process according to claim 8 in which the stable solid compound is separated from the melt.

16. A process for purifying a molten Group III element Q selected from the group consisting of gallium, indium, thallium and mixtures thereof in admixture with a Group VI element X selected from the group consisting of oxygen, sulfur, selenium and tellurium, the purification being sufficient to allow the epitaxial growth of a substantially dopant-free crystal Q from molten QX, said process comprising adding an element M, which is selected from the group consisting of scandium, yttrium and the lanthanides and capable of forming with the element X a stable solid compound substantially insoluble in liquid Q, to the melt, provided that, if the M atoms are not too large to enter the lattice of the crystal, the stable solid compound MX and any excess M are separated from the melt.

17. A process according to claim 16 in which M is lanthanum.

18. A process for the epitaxial growth of a crystalline semiconductor compound of the formula QZ from molten QZ in admixture with an element X,
wherein Q is a Group III element selected from the group consisting of gallium, indium, thallium and mixture thereof,
X is a Group VI element selected from oxygen, sulfur, selenium and tellurium, and
Z is a Group V element selected from phosphorus, arsenic and antimony,
comprising adding to the melt an element M' which is selected from the group consisting of scandium, yttrium and the lanthanides and is capable of reacting with X to form a stable solid compound substantially insoluble in liquid Q and substantially more stable under the conditions of the process than any compound formed by reaction between M' and Z and in which the M' atoms are too large to enter the lattice of the crystal.

19. A process according to claim 18 in which M' is lanthanum.

* * * * *